United States Patent [19]

Sakagami

[11] Patent Number: 5,157,287
[45] Date of Patent: Oct. 20, 1992

[54] SEMICONDUCTOR CIRCUIT DEVICE WITH INPUT THRESHOLD VALUE CORRECTION CIRCUIT

[75] Inventor: Takako Sakagami, Tokyo, Japan
[73] Assignee: NEC Corporation, Tokyo, Japan
[21] Appl. No.: 662,186
[22] Filed: Feb. 28, 1991
[30] Foreign Application Priority Data
  Mar. 2, 1990 [JP] Japan ..................... 2-50894
[51] Int. Cl.[5] ..................... H03K 17/30; H03K 17/22
[52] U.S. Cl. ..................... 307/491; 307/296.1; 307/296.5; 307/350
[58] Field of Search ............... 307/491, 296.1, 296.4, 307/296.5, 350, 264

[56] References Cited

U.S. PATENT DOCUMENTS 4,785,262 11/1988 Ryu et al. ............... 307/491 X
4,818,904 4/1989 Kobayashi ............... 307/296.5 X Primary Examiner—Eugene R. Laroche
Assistant Examiner—Do Hyun Yoo
Attorney, Agent, or Firm—Leydig, Voit & Mayer

[57] ABSTRACT

A semiconductor circuit device which has a first stage logic circuit for receiving an external input signal and a plurality of inverters for forwarding an output signal from said first stage logic circuit to a succeeding stage and which is to become active when an activating signal is active. The device includes a threshold value correcting circuit formed by a threshold value correcting inverter and a switching circuit. The switching circuit connects an output terminal of the threshold value correcting inverter to an output terminal of the first stage logic circuit only during the period in which the activating signal is in its active state. By having the threshold value correcting circuit operate synchronously with the activating signal, the input threshold level of the first stage logic circuit is corrected in accordance with the external input signal level in case there is a change in the power supply potential and the ground potential GND within the semiconductor chip and this ensures the proper operation of the first stage circuit.

7 Claims, 3 Drawing Sheets

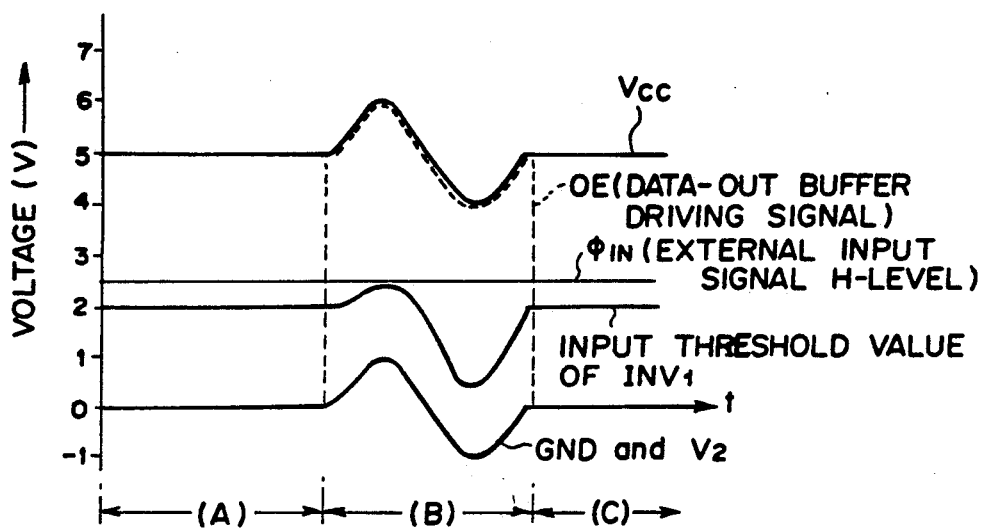
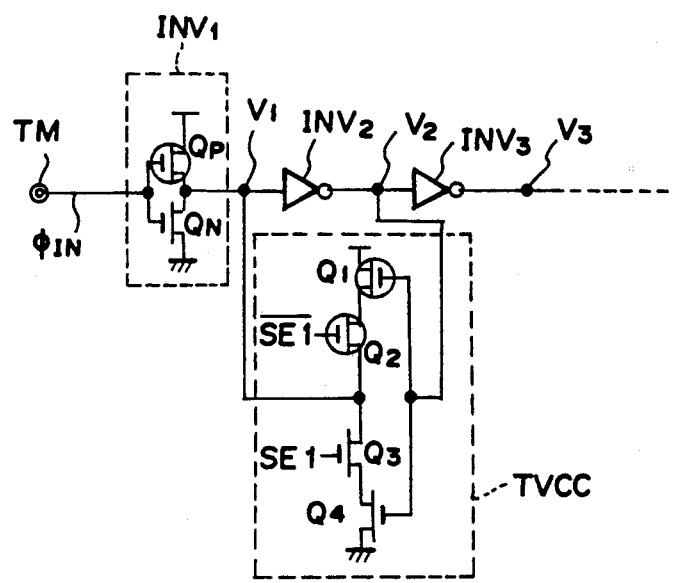

SEMICONDUCTOR CIRCUIT DEVICE WITH INPUT THRESHOLD VALUE CORRECTION CIRCUIT

BACKGROUND OF THE INVENTION

The present invention relates to a semiconductor circuit device which has a first stage logic circuit for receiving an external input signal and a plurality of inverters for forwarding an output from the first stage logic circuit to a following stage and which reaches an active state only when an activating signal applied thereto is active.

FIG. 5 shows in a circuit diagram a prior art semiconductor circuit device of the kind to which the present invention relates and FIG. 6 shows in waveforms a performance of the prior art device shown in FIG. 5.

In the illustrated prior art semiconductor circuit device, a first stage logic circuit consists of an input stage inverter circuit $INV_1$. The input stage inverter circuit $INV_1$ comprises a P-channel MOS transistor $Q_P$ (hereinafter referred to as "transistor $Q_P$") and an N-channel MOS transistor $Q_N$ (hereinafter referred to as "transistor $Q_N$"). This first stage inverter circuit $INV_1$ receives at its input a signal $\phi IN$ applied to an external terminal TM and outputs its output signal to a node $V_1$. Inverters $INV_2$, $INV_3$ operate as a buffer circuit and output the signal at the node $V_1$ to nodes $V_2$, $V_3$ in a serial order. An input threshold level of the inverter $INV_1$ in the circuit is determined by the conductance ratio of the transistors $Q_P$, $Q_N$ which constitute the inverter $INV_1$ itself but, as shown in FIG. 6, such threshold level fluctuates as a change takes place in a power supply potential $V_{cc}$ and a ground potential GND in a semiconductor chip.

In the prior art semiconductor circuit device as described above, whereas the input signal externally inputted to the first stage logic circuit is not influenced by a change in the power supply potential $V_{cc}$ and the ground potential GND within the semiconductor chip, the input threshold level of the first stage logic circuit is influenced by such change and does fluctuate. Thus, a drawback is that, at the time shown by an arrow in FIG. 6, there occur errors in the input level judging operation in the first stage logic circuit by the changes in the power supply potential $V_{cc}$ and the ground potential GND within the semiconductor chip.

SUMMARY OF THE INVENTION

It is, therefore, an object of the invention to overcome the problem existing in the conventional semiconductor circuit device and to provide an improved circuit device.

It is another object of the invention to provide a semiconductor circuit device in which no error occurs in the input level judging operation in the first stage logic circuit even when there is a change in the power supply potential $V_{cc}$ and the ground potential GND.

According to one aspect of the invention, there is provided a semiconductor circuit device comprising a first stage logic circuit for receiving an external input signal and a plurality of inverters for forwarding an output signal from the first stage logic circuit to a following stage. The semiconductor circuit device also comprises an inverter circuit for correcting an input threshold level of the first stage logic circuit. The inverter circuit receives an output signal of one of the odd number inverters of the plurality of inverters. Further, the semiconductor circuit device comprises a switching circuit for connecting an output terminal of the inverter circuit to an output terminal of the first stage logic circuit only during a period in which an activating signal is applied to the switching circuit in its active state.

According to the present invention, the input threshold level of the first logic circuit is corrected by the threshold value correcting circuit in synchronization with the activating signal for activating the circuit operation which has influence on changes in the power supply potential $V_{cc}$ and the ground potential GND.

The advantageous effect brought about by the invention is that, by having the threshold value correcting circuit operate synchronously with the activating signal, the input threshold level of the first stage logic circuit is corrected in accordance with the external input signal level in case there is a change in the power supply potential $V_{cc}$ and the ground potential GND within the chip and this ensures the proper operation of the first stage circuit.

BRIEF DESCRIPTION OF THE DRAWINGS

The above and other objects, features and advantages of the present invention will be apparent from the following description of preferred embodiments of the invention explained with reference to the accompanying drawings, in which:

FIGS. 2 and 3 show in timing charts the performance of the device of the first embodiment shown in FIG. 1;

FIG. 4 shows in a circuit diagram a semiconductor circuit device of a second embodiment according to the present invention;

PREFERRED EMBODIMENTS OF THE INVENTION

Throughout the following explanation, similar reference symbols or numerals refer to the same or similar elements in all the figures of the drawings.

Now, a first embodiment according to the present invention is explained with reference to the drawings.

Figure 1:
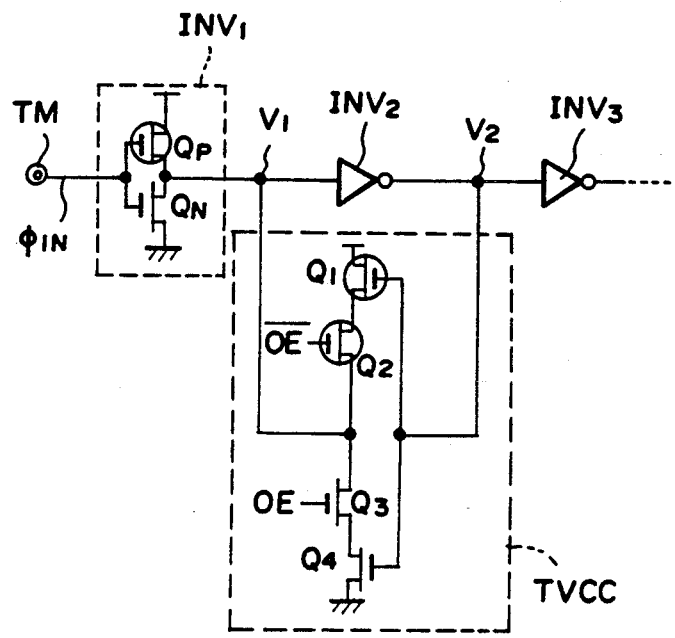
FIG. 1 shows in a circuit diagram a semiconductor circuit device of a first embodiment according to the present invention.
Figure 2:
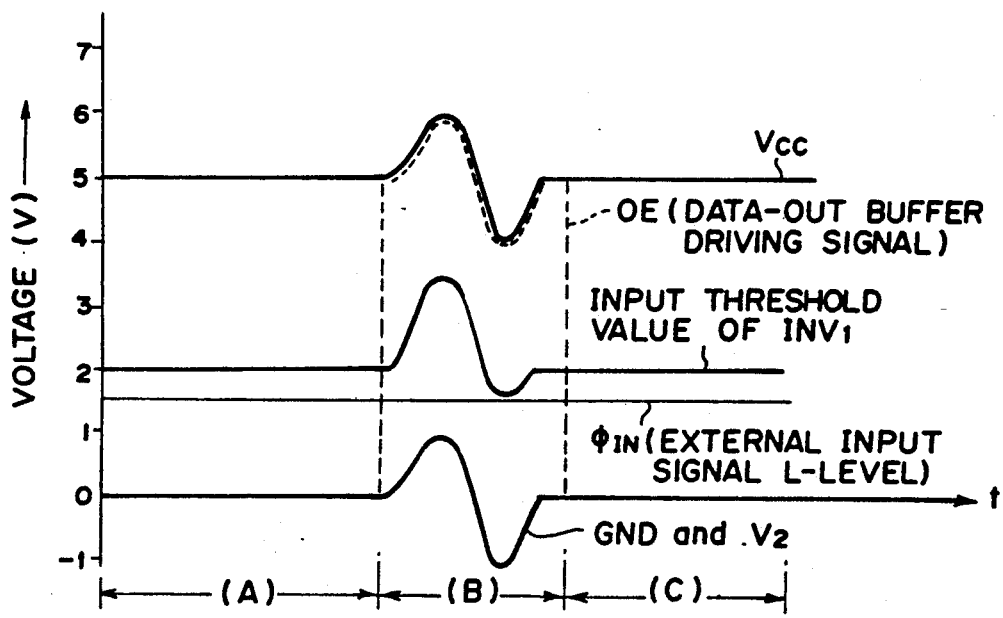

FIG. 1 shows in a circuit diagram a semiconductor circuit device of the first embodiment according to the invention and FIGS. 2 and 3 show in timing charts the performance of the circuit device shown in FIG. 1.

Figure 5A:
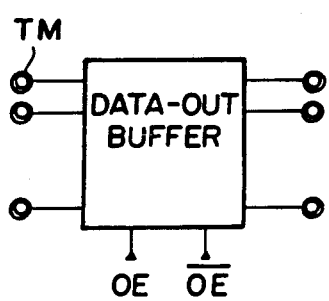
FIGS. 5(a) and 5(b) show in diagrams a prior art circuit.
Figure 5B:
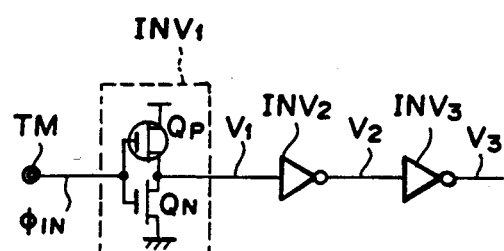
Figure 6:
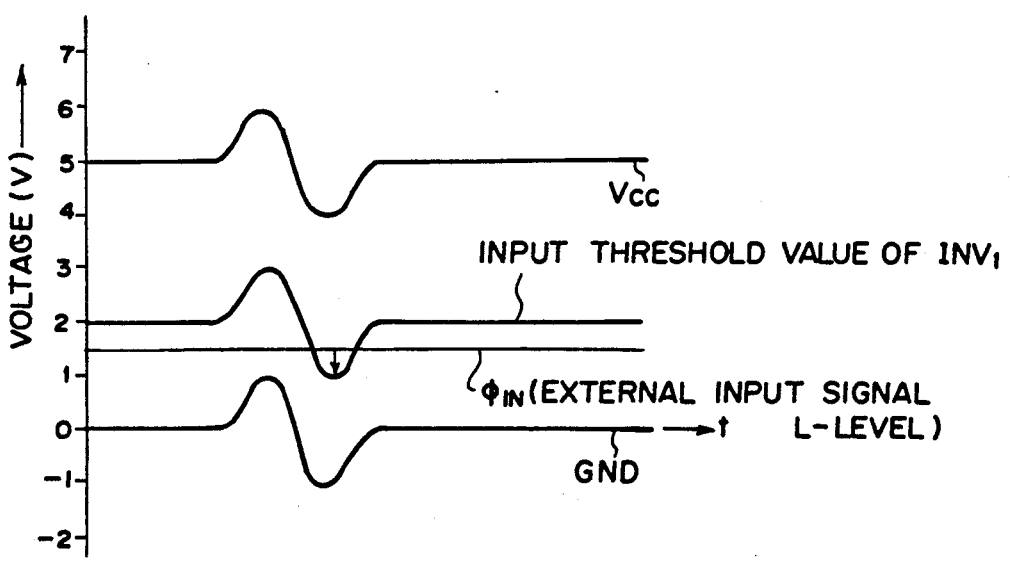
FIG. 6 shows in a timing chart the performance of the prior art circuit shown in FIGS. 5(a) and 5(b).

The semiconductor circuit device of the first embodiment is arranged such that, over the prior art device of FIG. 5, the device additionally includes a threshold value correcting circuit TVCC which comprises an inverter circuit formed by a P-channel MOS transistor $Q_1$ and an N-channel MOS transistor $Q_4$ and a switching circuit formed by a P-channel MOS transistor $Q_2$ and an N-channel MOS transistor $Q_3$ arranged at the output terminal side of the inverter circuit.

To the gate of the transistor $Q_3$ is applied a driving signal for a data-out buffer (hereinafter referred to as "driving signal OE") which is an activating signal and to the gate of the transistor $Q_2$ is applied a driving signal $\overline{OE}$ which is of a logical level opposite to the driving signal OE.

Next, the operation of the semiconductor circuit device of this first embodiment shown in FIG. 1 is explained with reference to FIGS. 2 and 3.

First, with reference to FIG. 2, an explanation refers to the case wherein the external input signal $\phi$IN is at its low level (hereinafter referred to as "L-level").

(i) Time period [A] (here, there are no changes in $V_{cc}$ and GND potentials)

The driving signal OE is in its L-level while the driving signal $\overline{OE}$ is in its high level (hereinafter referred to as "H-level") and, thus, the data-out buffer is in its non-active state. Therefore, under this state, there is no change in the power supply potential $V_{cc}$ and the ground potential GND within the semiconductor chip. Further, since the external input signal $\phi$IN is an input of L-level, the node $V_2$ is in its L-level.

Therefore, the transistor $Q_1$ to the gate of which is inputted the signal from the node $V_2$ turns on and the transistor $Q_4$ is cut off. Also, both the transistors $Q_2$ and $Q_3$ to the gates of which are inputted the driving signals $\overline{OE}$ and OE, respectively are cut off. That is, the threshold value correcting circuit is in its non-active state.

(ii) Time period [B] (here, there are changes in $V_{cc}$ and GND potentials)

When the driving signal OE turns to its H-level and the driving signal $\overline{OE}$ turns to its L-level, the data-out buffer is activated and the power supply potential $V_{cc}$ and the ground potential GND undergo large changes as shown in FIG. 2. Here, the transistors $Q_2$ and $Q_3$ to the gates of which are inputted the driving signals $\overline{OE}$ and OE, respectively, both turn on and the threshold value correcting circuit TVCC is activated. However, since the transistor $Q_4$ is in its OFF-state when the external input signal $\phi$IN is in an L-level input as explained under Item (i), the first stage logic circuit INV$_1$ is equivalent to the P-channel MOS transistor having gained its conductance so that the input threshold level of the inverter INV$_1$ is corrected to its rising or onreasing direction.

(iii) Time period [C] (here, there are no changes in $V_{CC}$ and GND potentials)

When the driving signal OE turns to its L-level while the driving signal $\overline{OE}$ turns to its H-level, the data-out buffer turns to its non-active state resulting in the ceasing of changes in the power supply potential $V_{CC}$ and the ground potential GND within the semiconductor chip. Consequently, both the transistors $Q_2$ and $Q_3$ to the gates of which are inputted the driving signals $\overline{OE}$ and OE are cut off and the threshold value correcting circuit returns to its non-active state whereby the same circuit operation as under Time period [A] takes place.

Next, an explanation refers to the case wherein the external input signal $\phi$IN is in its H-level with reference to FIG. 3.

(i) Time period [A] (here, there are no changes in $V_{cc}$ and GND potentials)

Since the external input signal $\phi$IN is an input of H-level, the node $V_2$ turns to its H-level. Consequently, the transistor $Q_1$ to the gate of which is inputted the signal from the node $V_2$ is cut off and the transistor $Q_4$ turns on. Other than this, the circuit operation is the same as that explained under Time period [A].

(ii) Time period [B] (here, there are changes in $V_{cc}$ and GND potentials)

When the driving signal OE turns to its H-level while the driving signal $\overline{OE}$ turns to its L-level, the data-out buffer is activated and the threshold value correcting circuit TVCC is activated. However, since the transistor $Q_1$ is in its cut-off state when the external input signal $\phi$IN is in its H-level as explained under Time period [A], the first stage logic circuit INV$_1$ becomes equivalent to the N-channel MOS transistor $Q_N$ having gained its conductance so that the input threshold level of the inverter INV$_1$ is corrected to the direction of the value being lowered or decreased.

(iii) Time period [C] (here, there are no changes in $V_{cc}$ and GND potentials)

The circuit operation here is the same as that under Time period [C] shown in FIG. 2.

FIG. 1 shows that the threshold value correcting circuit comprises two P-channel transistors $Q_1$, $Q_2$ in a stacked relation and two N-channel transistors $Q_3$, $Q_4$ in a stacked relation. However, this arrangement is of only one example and it is of course possible to change the number of transistors and the conductance of transistors constituting the correcting circuit depending on the required amount of correction of the input threshold level of the first stage logic circuit. Also, although FIG. 1 shows an example wherein the first stage logic circuit is an inverter, this may well be a NOR, NAND or other composite gate depending on the required purpose.

FIG. 4 shows in a circuit diagram a second embodiment according to the present invention. The device comprises an inverter INV$_1$ as the first stage logic circuit and inverters INV$_2$ and INV$_3$ operating as the buffer circuit. The threshold value correcting circuit for the first stage circuit comprises two P-channel MOS transistors $Q_1$, $Q_2$ in a stacked relation and two N-channel MOS transistors $Q_3$, $Q_4$ in a stacked relation. The inverter INV$_1$ receives an external signal $\phi$IN. Sense amplifier driving signals SE1 and $\overline{SE1}$ are respectively inputted to the gates of the P-channel MOS transistor $Q_2$ and the N-channel MOS transistor $Q_3$. The sense amplifier driving signal $\overline{SE1}$ is a signal having a phase opposite to that of the sense amplifier driving signal SE1 in the semiconductor memory. In the semiconductor memory, them power supply potential $V_{cc}$ and the ground potential GND within the semiconductor chip fluctuate also when the sense amplifier is driven.

Explanation concerning the operation of the second embodiment shown in FIG. 4 is ommited here since only the difference is that the driving signals OE, $\overline{OE}$ in the first embodiment is replaced by the sense amplifier driving signals SE1, $\overline{SE1}$.

When the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A semiconductor circuit device comprising:
   a first stage logic circuit for receiving an external input signal;
   a plurality of inverters for forwarding an output signal from said first stage logic circuit to a following stage;

an inverter circuit for correcting an input threshold level of said first stage logic circuit, said inverter circuit receiving an output signal of one of odd number inverters from said plurality of inverters; and a switching circuit for connecting an output terminal of said inverter circuit to an output terminal of sid first stage logic circuit only during a period in which an activating signal is applied to the switching circuit in its active state.

2. A semiconductor circuit device according to claim 1, in which said inverter circuit for correcting a threshold level of said first stage logic circuit comprises a P-channel MOS transistor and an N-channel MOS transistor and said switching circuit comprises a P-channel MOS transistor and an N-channel MOS transistor, said inverter circuit and said switching circuit forming a threshold value correcting circuit.

3. A semiconductor circuit device according to claim 2, in which the N-channel MOS transistor of said switching circuit has a gate to which is applied a data-out buffer driving signal as the activating signal and the P-channel MOS transistor of said switching circuit has a gate to which is applied a data-out buffer driving signal whose logic level is opposite to that said of the activating signal.

4. A semiconductor circuit device according to claim 2, in which the N-channel MOS transistor of said switching circuit has a gate to which is applied a sense amplifier driving signal as the activating signal and the P-channel MOS transistor of said switching circuit has a gate to which is applied a sense amplifier driving signal whose phase is opposite to that of the activating signal.

5. A semiconductor circuit device comprising:
a first stage logic circuit for receiving an external input signal;
a plurality of inverters connected to an output terminal of said first stage logic circuit, for forwarding an output signal from said first stage logic circuit to a following stage; and
a threshold value correcting circuit connected between an output terminal of one of odd number inverters from said plurality of inverters and the output terminal of said first stage logic circuit, for correcting an input threshold level of said first stage logic circuit in response to an activating signal applied to said threshold value correcting circuit which activates said threshold value correcting only during the period in which said activating signal is in its active state, said thereshold value correcting circuit including an inverter circuit for receiving an output signal of said odd number inverter and a switching circuit for connecting an output terminal of said inverter circuit to said output terminal of said first stage logic circuit only during the period in which said activating signal is in its active state.

6. A semiconductor circuit device according to claim 5, wherein said inverter circuit comprises a first P-channel MOS transistor having a source connected to a power supply potential terminal and gate connected to said output terminal of said odd number inverter and a first N-channel MOS transistor having a source connected to a ground potential terminal and gate connected to said output terminal of said odd number inverter; and said switching circuit comprises a second P-channel MOS transistor having a source connected to a drain of the first P-channel MOS transistor, a drain connected to said output terminal for said first stage logic circuit, and a gate receiving a data-out buffer driving signal as the activating signal; and a second N-channel MOS transistor having a source connected to a drain of the first N-channel MOS transistor, a drain connected to said output terminal of said first stage logic circuit, and a gate receiving a data-out buffer driving signal whose logic level is opposite to that of that activating signal.

7. A semiconductor circuit device according to claim 5, wherein said inverter circuit comprises a first P-channel MOS transistor having a source connected to a power supply potential terminal and a gate connected to said output terminal of said odd number inverter, and a first N-channel MOS transistor having a source connected to a ground potential terminal and a gate connected to said output terminal of said odd number inverter; and said switching circuit comprises a second P-channel MOS transistor having a source connected to a drain of the first P-channel MOS transistor, a drian connected to said output terminal of said first stage logic circuit, and a gate receiving a sense amplifier driving signal as the activating signal; and a second N-channel MOS transistor having a source connected to a drain of the first N-channel MOS transistor, a drain connected to said output terminal of said first stage logic circuit, and a gate receiving a sense amplifier driving signal whose level is opposite to that of the activating signal.

* * * * *

UNITED STATES PATENT AND TRADEMARK OFFICE
CERTIFICATE OF CORRECTION

PATENT NO. : 5,157,287

DATED : October 20, 1992

INVENTOR(S) : Takako Sakagami

It is certified that error appears in the above-identified patent and that said Letters Patent is hereby corrected as shown below:

Claim 1, column 5, line 7, change "sid" to --said--.

Claim 2, column 5, line 12, change "a" to --said input--.

Claim 3, column 5, line 25, delete "said".

Claim 6, column 6, line 28, change "that" (second occurrence) to --the--.

Claim 7, column 6, line 41, change "drian" to --drain--.

Claim 7, column 6, line 49, after "whose" insert --logic--.

Signed and Sealed this

Twenty-first Day of September, 1993

Attest:

BRUCE LEHMAN

*Attesting Officer*  *Commissioner of Patents and Trademarks*